METHOD OF MAKING MICROMINIATURE INCANDESCENT LAMPS

Original Filed March 4, 1960 2 Sheets-Sheet 1

INVENTOR,
DONALD J. BELKNAP

BY Harry M. Saragovitz,
Edward J. Kelly,
Herbert Berl & J. D. Edgerton
ATTORNEYS

METHOD OF MAKING MICROMINIATURE INCANDESCENT LAMPS

Original Filed March 4, 1960 2 Sheets-Sheet 2

INVENTOR,
DONALD J. BELKNAP
Harry M. Saragovitz,
BY Edward J. Kelly,
Herbert Berl & J. D. Edgerton
ATTORNEYS

3,193,906
METHOD OF MAKING MICROMINIATURE INCANDESCENT LAMPS

Donald J. Belknap, 302 Patterson Court, Takoma Park, Md.

Original application Mar. 4, 1960, Ser. No. 12,877, now Patent No. 3,040,204. Divided and this application Mar. 6, 1962, Ser. No. 193,030
5 Claims. (Cl. 29—25.11)
(Granted under Title 35, U.S. Code (1952), sec. 266)

This application is a division of application Serial No. 12,877, filed March 4, 1960, now Patent No. 3,040,204 issued June 19, 1962.

The invention described herein may be manufactured and used by or for the Government for governmental purposes without the payment to me of any royalty thereon.

This invention relates to incandescent lamps in general, and more specifically to a method of making microminiature lamps.

New electronic systems are continually being developed today. Many of them, such as giant computers, are extremely complex. To keep the size and power requirements down, it becomes very desirable to miniaturize as far as possible the electronic components and circuitry. Long-range missiles and space probes in particular require small, compact, electronic circuits. The development of the transistor and the use of printed circuit techniques have contributed greatly to efforts in the field of electronic miniaturization.

Extremely compact circuits have been constructed using hearing-aid type components and printed circuitry, resulting in component densities of about 150 components per cubic inch. Recently two-dimensional circuitry has been developed in which the active elements of electronic components, including transistors, are mounted on small ceramic wafers and are electrically connected by employing photolithographic techniques. By placing up to fifteen components on a one-half inch square ceramic wafer, the component density has been increased to about two thousand components per cubic inch.

With these advances in microelectronics, an urgent need developed for small, low-current indicator lamps to be used for read-out purposes in binary counting circuits. Available lamps were completely incompatible in size with other circuit components being used and in general required currents larger than the transistors could provide.

Broadly therefore it is an object of this invention to provide a microminiature incandescent lamp.

Another object of this invention is to provide a method for constructing a microminiature incandescent lamp.

Still another objective is to provide means whereby the said microminiature lamp can be simultaneously fabricated and tested.

The specific nature of the invention, as well as other objects, uses and advantages thereof, will clearly appear from the following description and from the accompanying drawing, in which:

FIG. 1 illustrates a microminiature lamp constructed in accordance with the instant invention.

FIGS. 2 to 4 schematically illustrate the basic steps for fabricating the lamp shown in FIG. 1.

According to this invention, microminiature incandescent lamps can be constructed which measure less than 0.10 inch in length and 0.025 inch in diameter. Light from these lamps operating at 1 to 1½ volts and 25 to 30 milliamperes of current is easily visible from any point in a normally lighted room. They thus meet the need for indicator lamps which will operate on the limited currents available in today's microelectronic computer circuitry. As a consequence of their small physical size and weight, these lamps are very rugged and able to withstand considerable shock and vibration.

Figure 1:
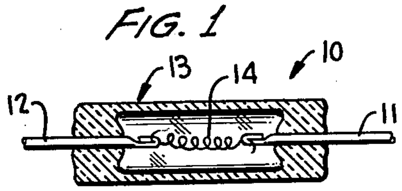

FIG. 1 illustrates a microminiature lamp 10 constructed in accordance with this invention. Lamp 10 comprises a pair of leads 11 and 12, a glass envelope 13 and a filament coil 14 encapsulated in the envelope and attached to the ends of leads 11 and 12. Leads 11 and 12, which extend from opposite ends of the microminiature lamp 10, are 0.75 inch lengths of .005 or 0.003 inch diameter platinum wire.

Figure 2:
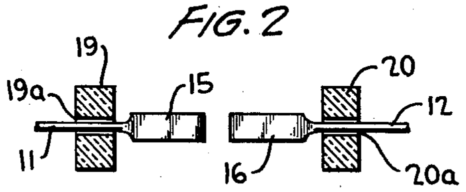
Figure 3:
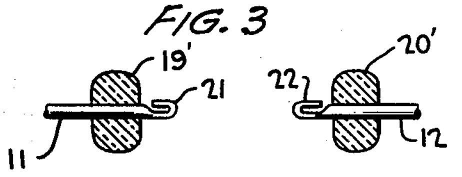

Referring now to FIG. 2, ends 15 and 16 of leads 11 and 12 are flattened by any conventional method, such as stamping or hammering. Cylindrical glass sleeves 19 and 20 are thereafter added to leads 11 and 12. Sleeves 19 and 20 are substantially identical in size and shape and may have a diameter of 0.030 inch for a somewhat smaller lamp. These sleeves are provided with bores **19*a* and 20*a*, which are slightly larger in diameter than the 0.005 or 0.003 inch diameter of leads 11 and 12 but are preferably not large enough to pass over flattened ends 15 and 16. The glass sleeves, when so positioned on leads 11 and 12, are heated in a small flame until they become somewhat spherical and become fused to the platinum leads. The spheres so produced are referred to by numerals 19' and 20'. Flattened ends 15 and 16 are then cut to a length approximately 0.015 inch and thereafter bent back to form hooks or eyelets 21 and 22 (FIG. 3) which can receive the opposite ends of coil 14**.

The beaded leads can also be prepared by spacing a number of the cylindrical glass sleeves 19 and 20 about one inch apart along a length of .005 or .003 inch platinum wire, which is supported by two posts with a means provided for applying slight tension to the wire. Current is passed through the wire to heat it to a temperature where the sleeves are sealed to it. The beaded leads are then separated by cutting, the ends near the beads being flattened and formed into hooks or eyelets.

Figure 4:
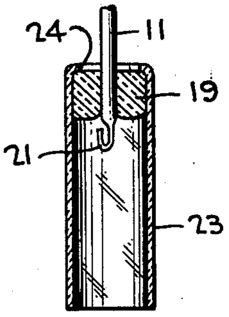

For a 1.5 volt lamp, coil 14 (FIG. 1) is formed of approximately 25 to 30 turns of 0.00025 inch diameter tungsten wire on a 0.001 inch diameter mandrel. Glass envelope 13 (FIG. 1) is composed of a cylindrical glass tube 23 (FIG. 4) into which the glass beads 19' and 20' will fit with preferably not more than 1 or 2 mils clearance. The thickness of tube 23 is approximately 2 mils. A tube length in the range of 0.05 to 0.09 inch is sufficient for a 25 turn filament. Tube 23 can be slid over beads 19' and 20' until end 24, which has been turned in very slightly by heating, contacts glass bead 19'. The turned-in end 24 permits the tube 23 to be sealed while hanging substantially vertically from bead 19'.

Figure 5:
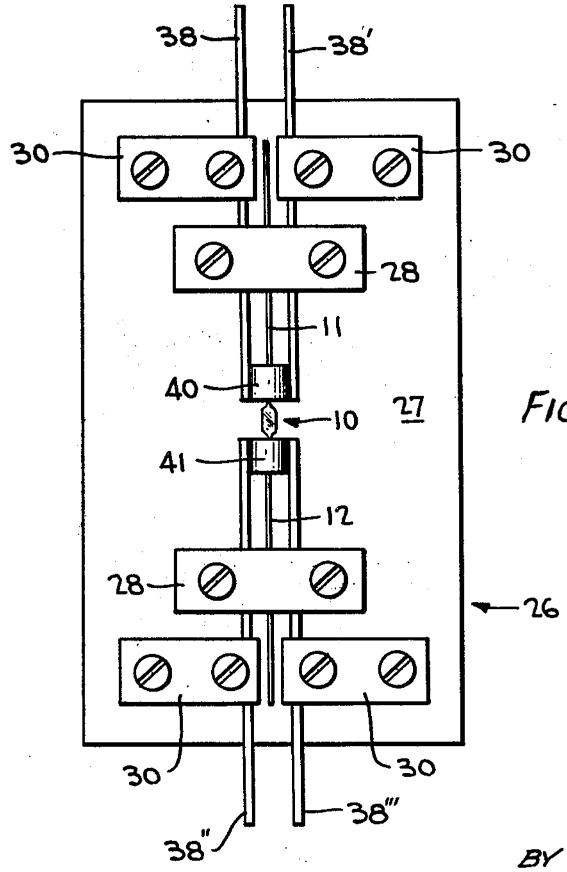
FIGS. 5, 5A and 5B show the jig by which the lamp components can be properly oriented.

In order to seal the glass envelope 13 with the filament coil 14 inside, a jig 26 (FIG. 5) is provided. Jig 26 comprises an insulating base 27 which supports a pair of substantially identical lamp lead supports 28 and two pairs of substantially identical heating cylinder lead supports 30. A typical cylinder lead support 30 is shown in FIG. 5*a* as consisting of upper and lower support plates 34 and 35, respectively. The lower support plate 35 is attached permanently to the base 27 by machine screws (not shown) passing up through the base. Machine screws 36 are used to fasten the upper plate 34 to the lower plate 35. A V-shaped groove 37 is formed in the lower plate 35 and it is in this groove that one cylinder lead 38 can be placed and fixed by tightening the machine screws 36 against upper cylinder lead support plate 34. Cylinder leads 38, 38', 38'', and 38''' are connected to opposite sides of hollow molybdenum heating cylinders 40 and 41. Heating cylinders 40 and 41 (FIG. 5) are molybdenum tubes with wall thicknesses of approximately 0.002 inch and internal diameters of approximately 0.060 inch. Thus, in assembling or removing a lamp the glass envelope 13 can be slid through heating cylinders 40 and 41 or a narrow slit can be provided in the cylinders through which the leads will pass. When current is passed through leads 38, 38', 38'', and 38''' cylinders 40 and 41 will radiate heat.

Figure 5B:
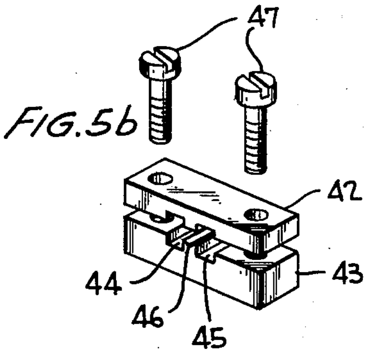
Figure 5A:
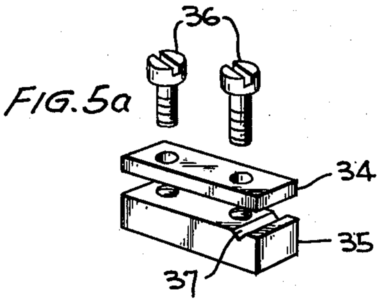

FIG. 5*b* shows an exploded perspective of one of the lamp lead supports 28. Supports 28 similarly consist of upper and lower support plates 42 and 43 which are provided with opposite rectangular grooves 44 and 45 through which a pair of cylinder leads 38 can pass without touching the supports. V-shaped groove 46, plate 42 and machine screws 47 cooperate to receive and hold the lamp leads 11 and 12 in the grooves 46.

Leads 11 and 12 are initially inserted through heating cylinders 40 and 41 and the ends placed in grooves 46 in the lower lead support plates 43, the upper lead support plates 42 being removed. Glass tube 23 is initially slid back over lead 11 to uncover bead 19 and expose hook 21. The heating cylinder leads 38, 38', 38'', and 38''' are fixed between the upper and lower support plates of supports 30 in a position where the ends of the heating cylinders almost contact supports 28, thereby making accessible the central region of the jig for attaching the filament. The ends of coil 14 are placed in hooks or eyelets 21 and 22, and these hooks or eyelets are thereafter closed tightly onto the ends of the coil by pinching. Alternately, the filament can be attached to one or both leads before they are placed in the jig. The upper lead support plates 42 are then placed upon lower lead support plates 43 and screws 47 tightened slightly against plate 42. The ends of leads 11 and 12 are then pulled slightly apart to give small separation between the turns of coil 14. Machine screws 47 are securely tightened so that the leads are tightly fixed in the supports 28. The glass tube 23 is slid over the two beads 19' and 20' from the initial position. The machine screws 36 are thereafter loosened so that heating cylinders 40 and 41 can be slid together until the ends of the cylinders are substantially aligned with the ends of the lamp 10, whereupon screws 36 are again tightened.

Figures 6, 6A, 6B:
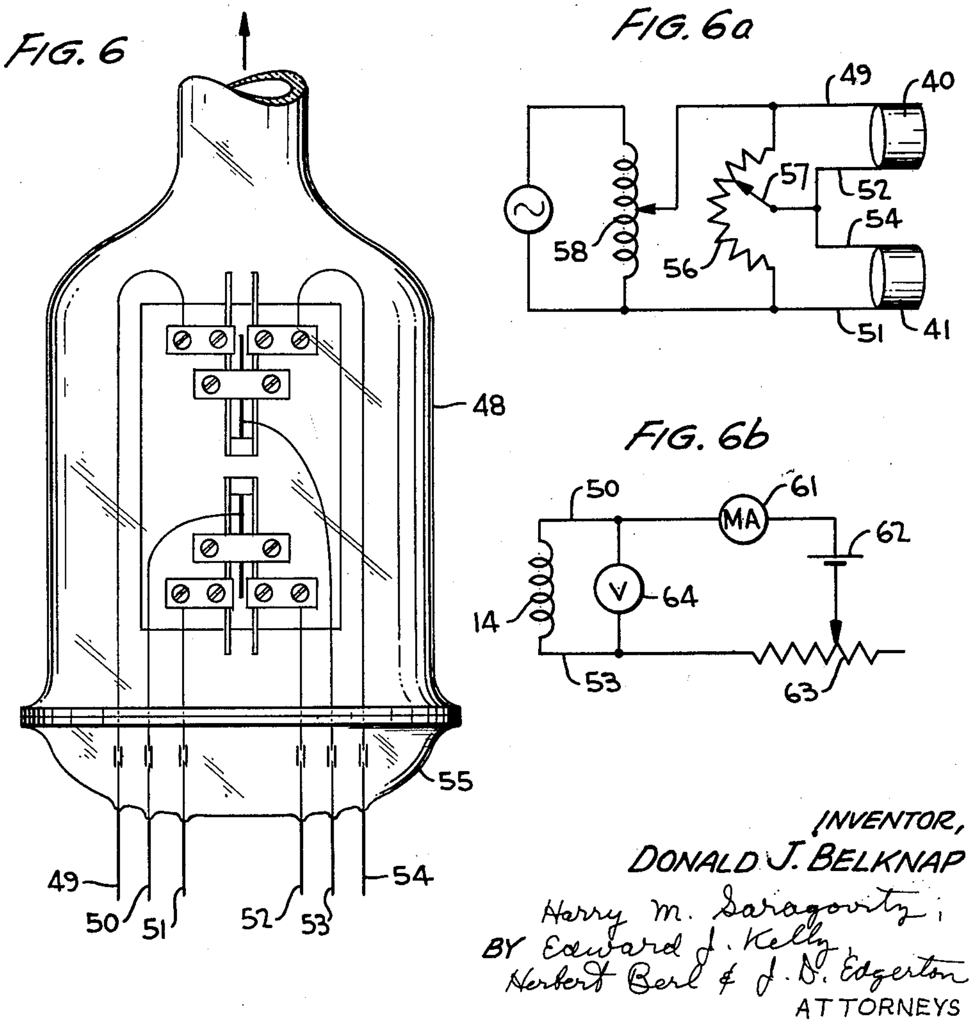
FIGS. 6, 6A and 6B illustrate the means required for sealing the microminiature lamp shown in FIG. 1.

Jig 26 is then placed vertically in a three inch tall bell jar 48 (FIG. 6) and connection made to leads 49, 50, 51, 52, 53 and 54 sealed through the bell jar base 55. These leads support jig 26 in the vertical position as shown in FIG. 6. The bell jar is pumped out to a vacuum of about $1\times10^{-4}$ mm. Hg.

The two cylinders 40 and 41 are connected electrically in series as shown schematically in FIG. 6*a* and a slide-wire rheostat 56 having slide 57 is placed across the combination. When current is applied, cylinders 40 and 41 will radiate heat to the lamp ends. The circuit shown in FIG. 6*a* makes it possible to bake out the lamp with the two cylinders heated to about the same temperature and then to turn up the heat in turn on each of the two cylinders by appropriately adjusting the autotransformer 58 and the rheostat 56 so that each end of the lamp 10 can be successively sealed. Filament 14 is connected to a monitoring circuit as shown in FIG. 6*b*. The monitoring circuit comprises a milliammeter 61, a battery 62, and a variable resistor 63 connected in series with filament 14 and a voltmeter 64 connected in shunt with filament 14. By adjusting the resistor 63, the lamp is operated during the sealing of the second end at a voltage sufficient to produce slight reddening of the filament 14. As soon as the lamp is sealed, the filament voltage and current begin to change. This is caused by the trapping of gas given off by the hot glass within the envelope 13. The gas within envelope 13 conducts heat away from filament 14 causing the resistance of the filament 14 to decrease. This decrease in resistance causes the current indicated by milliammeter 61 to increase and the voltage indicated by voltmeter 64 to decrease. When this change in current and voltage occurs, current to the cylinders is immediately turned off. Air is then admitted to the bell jar, the jig taken out, and the completed lamp is removed from the jig.

A microminiature lamp having a filament of 25 turns of 0.00025 inch tungsten wire wound on a 0.001 inch mandrel and constructed in accordance with the method of this invention typically has the following characteristics:

| Voltage | Current, ma. | Filament temperature, ° C (brightness) |
|---|---|---|
| 1.0 | 25 | 1,300 |
| 1.5 | 30 | 1,800 |

By varying the wire size and the turns of the filament those skilled in the art can construct lamps by the method of this invention having other voltage and current characteristics.

The lamps produced by the method of this invention are well adapted because of their small power requirement for use in all transistorized circuits such as computers, binary counters, switchboards and control panels. In consequence of their very small filaments which are positioned by closely spaced supports, they can be used in optical systems requiring a precisely positioned, point-source of light. Their small envelope size makes them useful as an illumination source for very small probes and medical endoscopes. Because of their lightness in weight, they can be mounted on the pointer tips of aircraft panel meters or other moving objects to indicate position or trajectory. They can also be used in arrays to print out numbers, graphs, or pictures with a frequency response not attainable by prior art incandescent lamps.

It will be apparent that the embodiments shown are only exemplary and that various modifications can be made in construction and arrangement within the scope of the invention as defined in the appended claims. For example, the glass envelope may be a hollow cylinder with one end sealed. Both pairs of leads may be fused in parallel relationship through a single glass bead. The filament can then be fixed to the ends of the leads across the gap between these ends. The bead can therefore be fused in the open end of the envelope by the method disclosed above while the envelope and the heating cylinders are under vacuum.

I claim as my invention:

1. A method of constructing a microminiature lamp, comprising the steps of fusing a glass bead to each of a pair of lead wires, forming the ends of each lead wire into a hook, inserting the ends of a filament coil into each hook so formed, pinching the hook together to fix said filament coil between said leads and each glass bead, and then fusing the ends of a hollow glass tube to each bead, in a vacuum.

2. A method of constructing microminiature incandescent lamps, comprising the steps of fusing a glass bead to each end of a pair of opposed wire leads, forming hooks at the extremities of each lead, inserting the ends of a filament coil into each hook so formed, pinching the hooks to fix said filament coil between said leads and each glass bead, then incasing said glass beads by a glass sleeve, heating the glass beads and the ends of said glass sleeve in a vacuum until said glass sleeve and beads fuse together.

3. A method of constructing microminiature incandescent lamps, comprising the steps of fusing a glass bead to each end of a pair of opposed wire leads, forming hooks at the extremities of each lead, inserting the ends of a filament coil into each hook so formed, pinching the hooks to fix said filament between said leads and each glass bead, heating one end of a hollow glass tube having an internal diameter slightly larger than the diameter of each bead until said end turns in sufficiently to contact the periphery of one glass bead, suspending said glass tube by the turned-in end from one bead, the other end of said tube encasing the other bead and said filament coil fixed between said leads and each glass bead, then successively heating each end of said tube, in a vacuum until the beads and tube fuse together.

4. A method of constructing microminiature incandescent lamps, comprising the steps of fusing a glass bead to each end of a pair of opposed wire leads, forming hooks at the extremities of each lead, inserting the ends of a filament coil into each hook so formed, pinching the hooks together to fix the filament coil between said leads and each glass bead, heating one end of a hollow glass tube having an internal diameter slightly larger than the diameter of each glass bead until said end turns in sufficiently to contact the periphery of one glass bead, suspending said glass tube by the turned-in end from one glass bead, the other end of said glass tube encasing the other glass bead and said filament coil fixed between said leads and each glass bead, then positioning a heating element adjacent each end of the suspended glass tube, heating each end of said suspended glass tube in a vacuum with the positioned heating elements to bake out the lamp assembly, then increasing the heat in turn applied to each end of said suspended glass tube in a vacuum by said heating elements to successively fuse said glass beads to said glass tube.

5. A method of constructing microminiature incandescent lamps, comprising the steps of fusing a glass bead to each end of a pair of opposed leads, forming hooks at the extremities of each lead, inserting the ends of a filament coil into each hook so formed, pinching the hooks together to fix the filament coil between said leads and each glass lead, heating one end of a hollow glass tube having an internal diameter slightly larger than the diameter of each glass bead until said end turns in sufficiently to contact the periphery of one glass bead, suspending said glass tube by the turned-in end from one glass bead, the other end of said glass tube encasing the other glass bead and said filament coil fixed between said leads and each glass bead, then positioning a heating element adjacent each end of the suspended glass tube, heating each end of said suspended glass tube in a vacuum with the positioned heating elements to bake out the lamp assembly, then increasing the heat applied to one end of said suspended glass tube in a vacuum to fuse one of said glass beads to said glass tube, then passing a current through said filament coil sufficient to produce slight reddening of the filament while simultaneously increasing the heat applied to the other end of said glass tube in a vacuum to fuse the other of said glass bead to said glass tube, and monitoring the filament coil characteristic during the fusing of said other glass bead to said glass table.

References Cited by the Examiner

UNITED STATES PATENTS

| | | | |
|---|---|---|---|
| 461,797 | 10/91 | Marshal | 29—25.14 |
| 722,702 | 3/03 | Hanks | 29—25.14 |
| 1,755,983 | 4/30 | Erber et al. | 29—25.13 |
| 2,079,893 | 5/37 | Bain et al. | 29—25.13 |
| 2,199,879 | 5/40 | Deroche | 29—155.64 |
| 2,685,762 | 8/54 | Mullan | 29—25.19 |
| 2,832,016 | 4/58 | Bakalar | 29—25.3 |
| 2,940,220 | 6/60 | Roeber | 29—25.19 |
| 2,992,874 | 7/61 | Germeshausen | 316—19 |
| 3,069,583 | 12/62 | Swasey | 29—25.13 |

FOREIGN PATENTS

| | | |
|---|---|---|
| 1,167,971 | 12/58 | France. |

RICHARD H. EANES, Jr., *Primary Examiner.*

LEON PEAR, *Examiner.*